United States Patent [19]
Fotouhi et al.

[11] Patent Number: 6,111,433
[45] Date of Patent: Aug. 29, 2000

[54] DIFFERENTIAL OUTPUT DRIVER WITH MONOTONIC OUTPUT TRANSITIONS

[75] Inventors: Bahram Fotouhi, Cupertino; Bahman Farzan, Mountain View, both of Calif.

[73] Assignee: Exar Corporation, Fremont, Calif.

[21] Appl. No.: 09/089,615

[22] Filed: Jun. 3, 1998

[51] Int. Cl.[7] .................... H03K 19/0175; H03K 19/094
[52] U.S. Cl. ................... 326/87; 326/91; 326/86
[58] Field of Search .................. 326/87, 86, 85, 326/91, 90, 113

[56] References Cited

U.S. PATENT DOCUMENTS

| | | | |
|---|---|---|---|
| 4,129,793 | 12/1978 | Bula et al. | 326/87 |
| 4,195,238 | 3/1980 | Sato | 326/87 |
| 4,964,140 | 10/1990 | Yonekura | 375/36 |
| 5,138,199 | 8/1992 | Hirata et al. | 326/85 |
| 5,227,673 | 7/1993 | Ta | 307/279 |
| 5,414,314 | 5/1995 | Thurber, Jr. | 327/427 |
| 5,656,955 | 8/1997 | Chai et al. | 326/115 |
| 5,917,340 | 6/1999 | Manohar et al. | 326/82 |

*Primary Examiner*—Michael Tokar
*Assistant Examiner*—Daniel D. Chang
*Attorney, Agent, or Firm*—Townsend and Twonsend and Crew LLP

[57] ABSTRACT

Method and circuitry for differential output driver with monotonic output transitions. The switching sequence for the output driver transistors of the differential driver changes depending on the direction of the input signal transition. When the input makes a binary transition from high to low, each one of the output driver transistors is switched on or off at a different time based on a first predetermined sequence. When the input makes the opposite binary transition (low to high), each one of the output driver transistors is switched on or off at a different time based on a second predetermined sequence that is different than the first sequence. The predetermined sequences are designed to eliminate any possibility of a glitch or non-monotonic behavior at the output terminals.

20 Claims, 3 Drawing Sheets

DIFFERENTIAL OUTPUT DRIVER WITH MONOTONIC OUTPUT TRANSITIONS

BACKGROUND OF THE INVENTION

The present invention relates in general to integrated circuits, and in particular to an improved differential output driver circuit with monotonic output transitions.

A differential output driver typically includes a pair of separate output drivers respectively driving a complementary pair of output terminals in response to an input signal. Such differential output drivers can be found in a variety of circuit applications. Often, and in particular in telecommunication applications, the pair of output terminals are resistively coupled to each other. For example, an RS422 driver circuit is required to drive differential output terminals that are connected together by a termination resistor of about 100 Ohms. With the signals at the output terminals switching in opposite directions, this resistive coupling can give rise to glitches on the output signals during their transition from one binary state to another. That is, if the timing of the switching of the output transistors is not designed properly, the output of one driver that is active may cause the signal at the other output that may be tri-stated move in the same direction. This results in non-monotonic signal transitions at the outputs.

There are certain applications such as RS422 drivers that require monotonic output signal transitions. Therefore, there is a need for circuitry and methods that eliminate non-monotonic switching at the output of differential drivers.

SUMMARY OF THE INVENTION

The present invention provides method and circuitry for differential output driver with monotonic output transitions. Broadly, according to the present invention, the switching sequence for the output driver transistors of the differential driver changes depending on the direction of the input signal transition. When the input signal makes a binary transition from high to low, each one of the output driver transistors is switched on or off at a different time based on a first predetermined sequence. When the input signal makes the opposite binary transition (low to high), each one of the output driver transistors is switched on or off at a different time based on a second predetermined sequence that is different than the first sequence. The predetermined sequences are designed to eliminate any possibility of a glitch or non-monotonic behavior at the output terminals.

Accordingly, the present invention provides in one embodiment, a differential output driver including a first driver circuit having a plurality of transistors and driving a first output terminal, a second driver circuit having a plurality of transistors and driving a second output terminal, and an output driver control circuit coupled to the first and second driver circuits, wherein, the output driver control circuit switches the plurality of transistors in the first and the second driver circuits ON or OFF according to a first sequence in response to an input signal making a first binary transition, and a second sequence in response to the input signal making a second binary transition opposite to the first binary transition.

A better understanding of the nature and advantages of the differential output driver of the present invention may be gained with reference to the detailed description and drawings below.

DESCRIPTION OF THE PREFERRED EMBODIMENT

Figure 1A:
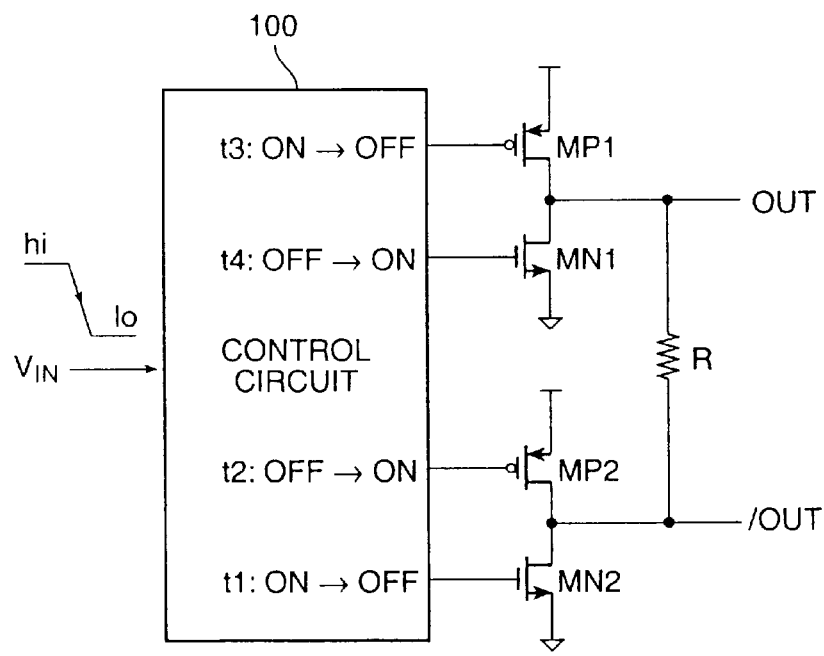
FIGS. 1A and 1B are simplified diagrams illustrating the operation of the differential output driver of the present invention.
Figure 1B:
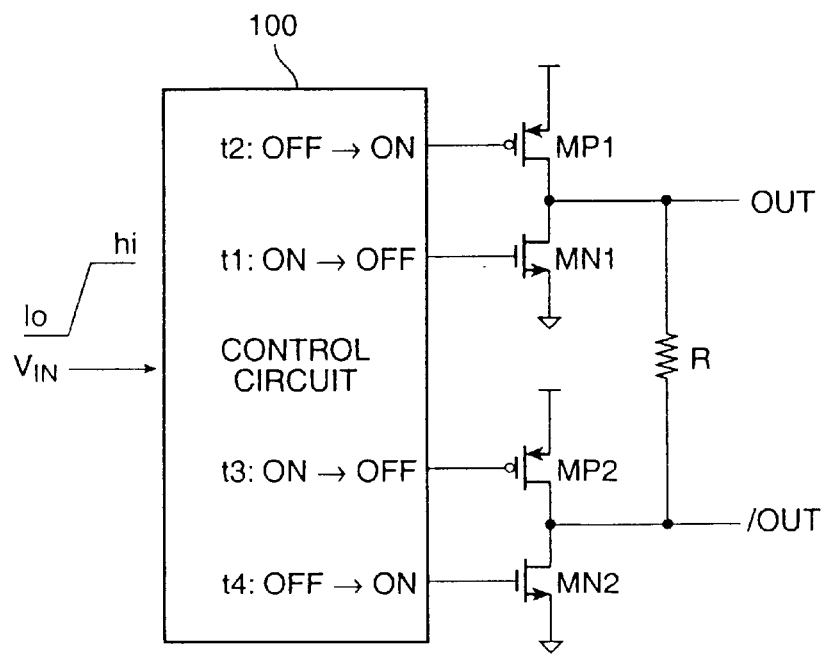

To eliminate non-monotonic output transitions during binary state change of a differential output driver, the present invention provides a specific transistor switching sequence that changes depending on the direction of the transition. FIGS. 1A and 1B illustrate the two different switching sequences for the output transistors of the differential output driver according to the present invention. The differential output driver includes a first driver made up of transistors MP1 and MN1 that drive terminal OUT, and a second complementary driver made up of MP2 and MN2 that drive terminal /OUT. A control circuit 100 drives the gate terminals of transistors MP1, MN1, MP2, and MN2 in response to the input signal Vin and according to a predetermined timing sequence.

The case where the input signal Vin makes a binary transition from high to low is shown in FIG. 1A. Under this condition, OUT makes a binary high to low transition and /OUT makes a binary low to high transition. To pull OUT from high to low, transistor MP1 must switch off and transistor MN1 is switched on. To pull /OUT from low to high, transistor MN2 must switch off, and transistor MP2 is switched on. The on/off timing of these transistors becomes critical if glitches are to be avoided. Consider the following timing condition: to pull OUT low, transistor MP1 turns off before transistor MN1 is fully turned on, and OUT starts the falling transition. However, if before transistor MN1 if fully turned on, transistor MN2 turns off and transistor MP2 turns on, transistor MP2 could drive high both /OUT and OUT (through termination resistor R). This will cause the signal on OUT which had already started the falling transition to be momentarily pulled back high before transistor MN1 fully turns on overriding transistor MP2 and returning OUT to binary low. This glitch results in an undesirable non-monotonic falling transition on OUT. Optimizing the timing sequence for the on/off switching of the transistors for the falling transition, however, does not address a similar problem from occurring when Vin makes the opposite transition.

The output driver of the present invention controls the on/off timing of the output transistors with two different sequences; one sequence that is optimized for the rising transition of Vin and another sequence that is optimized for the falling transition of Vin. The two sequences are designed to guarantee that output transitions occur monotonically in either direction. Referring back to FIG. 1A, the on/off timing sequence according to the present invention for the output transistors when Vin makes a falling transition is shown inside control circuit 100. When Vin makes a binary high to low transition, control circuit 100 operates such that transistor MN2 turns off first at time t1, followed by transistor MP2 turning on at time t2. Transistor MP1 then turns off at time t3, and transistor MN1 turns on last at time t4. An analysis of the signal behavior at OUT and /OUT shows that with this sequence there is not time at which the output of one driver is able to drive both outputs. The same sequence, however, does not guarantee monotonic output signal transitions when Vin makes the opposite (low to high) binary transition.

Referring to FIG. 1B, there is shown a different on/off timing sequence for the output transistor that guarantees monotonic output transitions when Vin switches from low to high. In response to a rising transition at Vin, control circuit 100 operates such that first transistor MN1 turns off at time t1 followed by transistor MP1 turning on at time t2. Transistor MP2 then turns off at time t3, and transistor MN2 turns on last at time t4. This sequence guarantees that transitions at OUT and /OUT occur monotonically when Vin switches from low to high.

Figure 2:
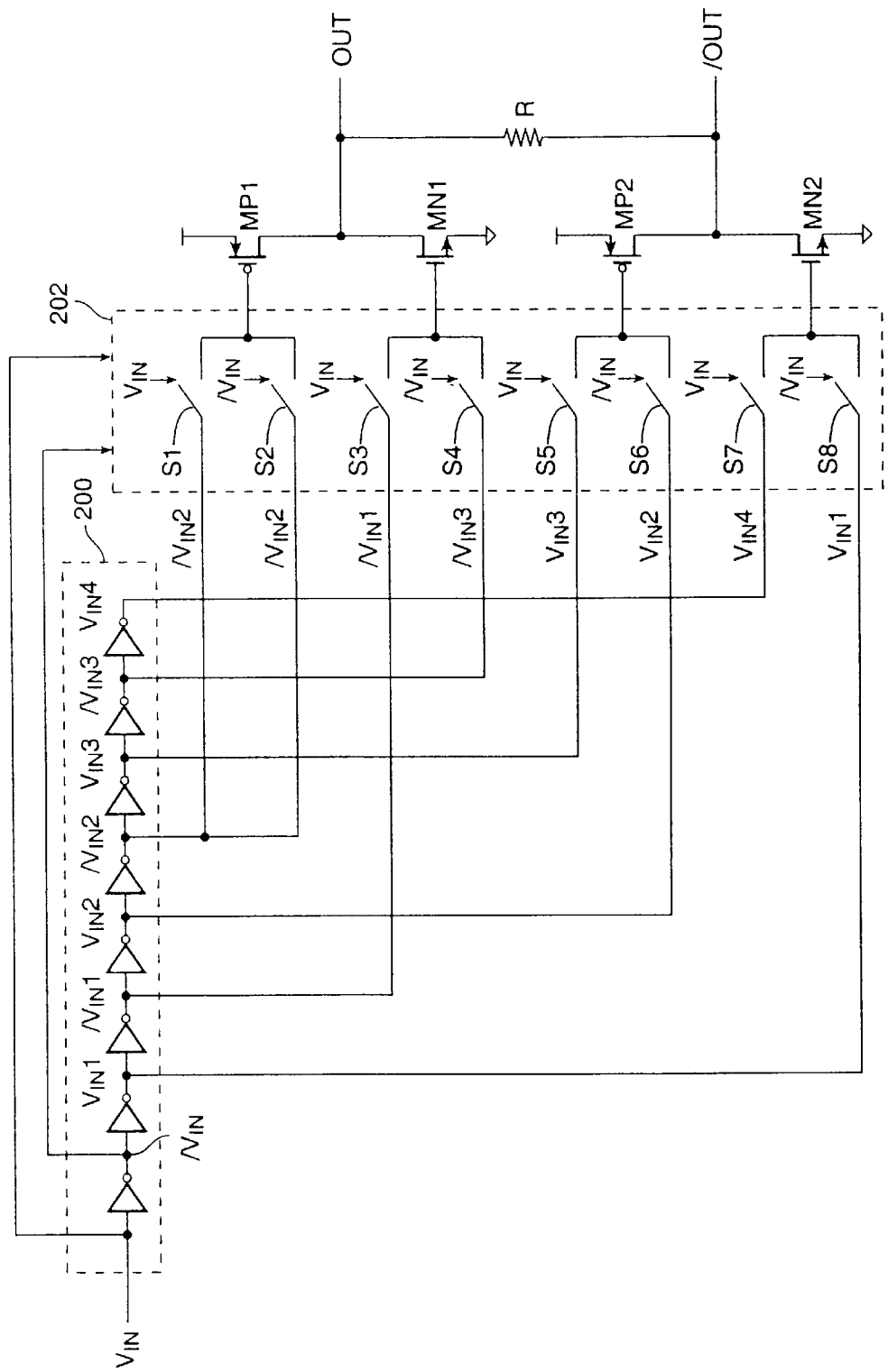
FIG. 2 shows a simplified circuit implementation for the differential output driver according to the present invention.

Thus, control circuit 100 performs two functions; it generates the two on/off timing sequences, and switches from one to the other depending on the signal transition at Vin. FIG. 2 is a circuit diagram of the differential output driver showing a simplified implementation for the control circuit according to one embodiment of the present invention. The signal Vin is applied to the input of a chain of eight inverters 200, each of which introduces a known gate delay. A bank of eight switches 202 selectively connects the signals at various nodes along inverter chain 200 to the gate terminals of driver transistors MN1, MP1, MN2, and MP2. Thus, the combination of inverter chain 200 and switch bank 202 allows the designer to generate and switch between two timing sequences in response to Vin. The connections as shown in FIG. 2 implement the two timing sequences discussed in connection with FIGS. 1A and 1B.

With Vin starting at a binary high, switches S1, S3, S5 and S7 are closed and switches S2, S4, S6 and S8 are open. Signals /Vin2, /Vin1, Vin3 and Vin4 are respectively applied to gate terminals of transistors MP1, MN1, MP2 and MN2. Transistors MP1 and MN2 are on and MN1 and MP2 are off, resulting in a binary high at OUT and binary low at /OUT. Once Vin switches to a binary low, all switches reverse their state, connecting signals /Vin2, /Vin3, Vin2, and Vin1 respectively to gate terminals of transistors MP1, MN1, MP2, and MN2. Of these four signals, Vin1 arrives first with two gate delays after Vin. Thus, transistor MN2 switches from on to off first at time t1 (as shown in FIG. 1A). Signal Vin2 arrives two gate delays after Vin1, switching transistor MP2 from off to on at time t2. Next, signal /Vin2 arrives one gate delay after Vin2, switching transistor MP1 from on to off at time t3. Finally, signal /Vin3 arrives two gate delays after /Vin2, switching transistor MN1 from off to on at time t4.

In the other direction, with Vin starting at a binary low, switches S2, S4, S6, and S8 are closed and switches S1, S3, S5, and S7 are open. Signals /Vin2, /Vin3, Vin2 and Vin1 are respectively applied to gate terminals of transistors MP1, MN1, MP2, and MN2. Transistors MN1 and MP2 are on and MN2 and MP1 are off, resulting in a binary low at OUT and binary high at /OUT. Once Vin switches to a binary high, all switches reverse state, connecting signals /Vin2, /Vin1, Vin3 and Vin4 respectively to gate terminals of transistors MP1, MN1, MP2, and MN2. This time, the sequence in which these four signals arrive differ from the above. Signal /Vin1 arrives first (three gate delays after Vin) at the gate terminal of transistor MN1, switching it from on to off at time t1. Signal /Vin2 arrives two gate delays after /Vin1, switching transistor MP1 from off to on at time t2. Next, signal Vin3 arrives one gate delay after /Vin2, switching transistor MP2 from on to off at time t3. Finally, signal Vin4 arrives two gate delays thereafter to switch transistor MN2 from off to on at time t4. Thus, OUT and /OUT make their respective transitions monotonically.

Figure 3:
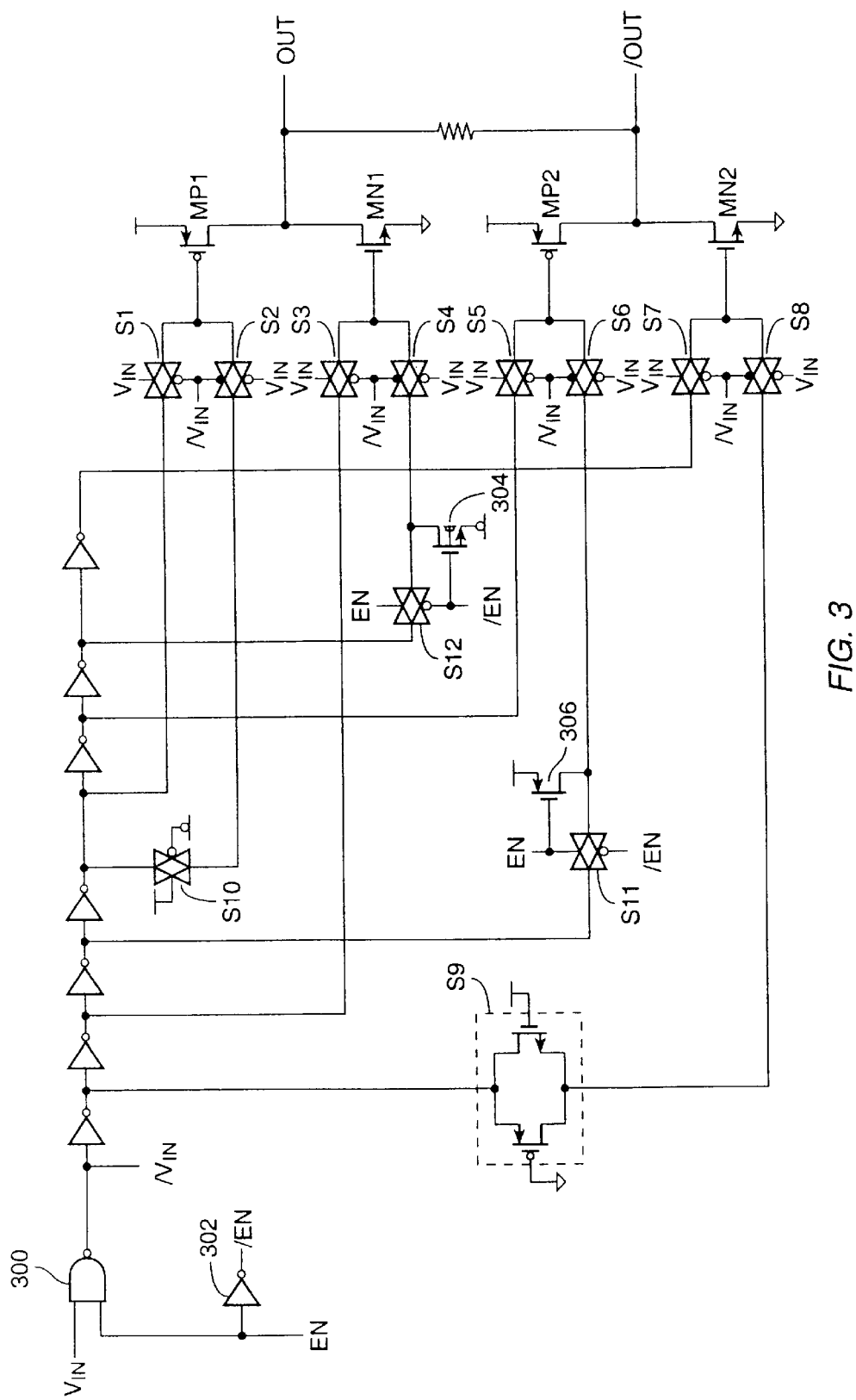
FIG. 3 is an exemplary circuit implementation of the differential output driver showing the circuit according to one embodiment of the present invention in greater detail.

FIG. 3 shows an exemplary circuit implementation for the differential output driver. In this embodiment, switches are implemented using CMOS transmission gates such as the one shown for switch S9, circuitry has been added to tri-state the output, and delay elements have been inserted along various signal paths to equalize signal propagation delays to achieve optimum timing sequence. In certain applications, such as an RS422 driver, the circuit is required to provide for the option of tri-stating the outputs. To accomplish that, the exemplary embodiment shown in FIG. 3 changes the first inverter in inverter chain 200 into a two-input NAND gate 300 that receives Vin at one input and an enable signal EN at the other. An extra inverter 302 generates the inverse of enable /EN. A pull-down n-channel transistor 304 connects through switch S4 to the gate terminal of output transistor MN1 and a pull-up p-channel transistor 306 connects through switch S6 to the gate terminal of output transistor MP2. When EN is pulled to a logic low, both transistors 304 and 306 are turned on, and transmission gates S11 and S12 are turned off. This ensures that all four output transistors MP1, MN1, MP2, MN2 are turned off, resulting in a tri-state condition at the outputs.

Because transmission gates S11 and S12 introduce delay along their respective signal paths, care should be taken to ensure that the designed for sequence is not disturbed. Transmission gates S9 and S10 are thus added along the paths as shown to equalize signal propagation delays along the various signal paths. Since their only purpose is to introduce an equal amount of delay along their respective signal paths, the gate terminals of the transistors in transmission gates S9 and S10 are connected to the supply voltages such that they are always on.

In conclusion, the present invention provides method and circuitry for a differential output driver with monotonic output transitions. According to the invention, non-monotonic transition are eliminated by changing the switching sequence for the output driver transistors of the differential driver changes depending on the direction of the input signal transition. While the above is a complete description of the preferred embodiment of the present invention, it is possible to use various alternatives, modifications and equivalents. For example, the intended sequence can be arrived at with means other than an inverter chain, and switches can be implemented using circuit elements other than CMOS transmission gates. Also, pull-down and pull-up output driver transistors may both be of the same polarity (i.e., both p-channel or both n-channel) which would require an appropriate inversion of the controlling signal for one or the other of the transistors. Therefore, the scope of the present invention should be determined not with reference to the above description but should, instead, be determined with reference to the appended claims, along with their full scope of equivalents.

What is claimed is:

1. A differential output driver comprising:
   a first driver circuit having a plurality of transistors, the first driver circuit driving a first output terminal;
   a second driver circuit having a plurality of transistors, the second driver circuit driving a second output terminal; and
   an output driver control circuit coupled to the first and second driver circuits,
      wherein, the output driver control circuit switches the plurality of transistors in the first and the second driver circuits ON or OFF according to a first sequence in time in response to an input signal making a first binary transition, and a second sequence in time different than the first sequence, in response to the input signal making a second binary transition opposite to the first binary transition.

2. The differential output driver of claim 1 wherein the plurality of transistors in the first driver circuit comprise:
a pull-up transistor coupled between the first output terminal and a source of binary high voltage; and
a pull-down transistor coupled between the first output terminal and a source of binary low voltage.

3. The differential output driver of claim 2 wherein the plurality of transistors in the second driver circuit comprise:
a pull-up transistor coupled between the second output terminal and a source of binary high voltage; and
a pull-down transistor coupled between the second output terminal and a source of binary low voltage.

4. The differential output driver of claim 3 wherein the output driver control circuit comprises:
a plurality of inverters coupled in series and having an input coupled to receive the input signal; and
a plurality of switches coupled between the plurality of inverters and the plurality of transistors in each of the first and second driver circuits.

5. The differential output driver of claim 3 wherein a gate terminal of each pull-up and pull-down transistor in each of the first and second driver circuits couples to a first switch controlled by the input signal and a second switch controlled by a complement of the input signal.

6. The differential output driver of claim 3 wherein the pull-up transistor in the first driver circuit is a p-channel transistor with a gate terminal coupled to a first switch and a second switch respectively controlled by the input signal and the complement of the input signal.

7. The differential output driver of claim 6 wherein the pull-down transistor in the first driver circuit is an n-channel transistor with a gate terminal coupled to a third switch and a fourth switch respectively controlled by the input signal and the complement of the input signal.

8. The differential output driver of claim 7 wherein the pull-up transistor in the second driver circuit is a p-channel transistor with a gate terminal coupled to a fifth switch and a sixth switch respectively controlled by the input signal and the complement of the input signal.

9. The differential output driver of claim 8 wherein the pull-down transistor in the second driver circuit is an n-channel transistor with a gate terminal coupled to a seventh switch and an eighth switch respectively controlled by the input signal and the complement of the input signal.

10. The differential output driver of claim 9 wherein
the eighth switch couples to a first signal having the same polarity as the input signal,
the third switch couples to a second signal that is delayed with respect to the first signal and has the opposite polarity as the input signal,
the sixth switch couples to a third signal that is delayed with respect to the second signal and has the same polarity as the input signal,
the first and the second switches couple to a fourth signal that is delayed with respect to the third signal and has the opposite polarity as the input signal,
the fifth switch couples to a fifth signal that is delayed with respect to the fourth signal and has the same polarity as the input signal,
the fourth switch couples to a sixth signal that is delayed with respect to the fifth signal and has the opposite polarity as the input signal, and
the seventh switch couples to a seventh signal that is delayed with respect to the sixth signal and has the same polarity as the input signal.

11. The differential output driver of claim 10 wherein the first to seventh signals are generated at various outputs of a chain of inverters that receives the input signal at its input.

12. The differential output driver of claim 11 wherein the chain of inverter comprises eight serially-coupled inverters with the first inverter generating the complement of the input signal, the second inverter generating the first signal, the third inverter generating the second signal, the fourth inverter generating the third signal, the fifth inverter generating the fourth signal, the sixth inverter generating the fifth signal, the seventh inverter generating the sixth signal and the eighth inverter generating the seventh signal.

13. The differential output driver of claim 5 wherein the first and the second switch each comprise a CMOS transmission gate.

14. The differential output driver of claim 9 wherein each of the first to eighth switches comprises a CMOS transmission gate.

15. A method for driving differential outputs comprising the steps of:
switching a plurality of output driver transistors on or off according to a first predetermined sequence in time in response to an input signal making a first binary transition; and
switching the plurality of output driver transistors on or off according to a second predetermined sequence that is different than the first predetermined sequence in response to the input signal making a second binary transition opposite to the first binary transition.

16. The method of claim 15 wherein each switching step comprises the steps of:
generating a plurality of drive signals having predetermined delays with respect to each other, in response to the input signal; and
respectively coupling the plurality of drive signals to the plurality of output driver transistors via a respective plurality of switches.

17. A differential output driver for driving an input signal onto a first output terminal and second output terminal, the output driver comprising:
a first pull-up transistor and a first pull-down transistor coupled to drive the first output terminal;
a second pull-up transistor and a second pull-down transistor coupled to drive the second output terminal; and
a control circuit coupled to the first and second pull-up transistors and the first and second pull-down transistors, the control circuit including:
a delay generator coupled to receive the input signal and to generate a plurality of delayed versions of the input signal, each having a different delay; and
a plurality of switches configured to selectively couple the delayed versions of the input signal to gate terminals of the first and second pull-up transistors and first and second pull-down transistors,
wherein, a different set of the plurality of delayed versions of the input signal couple to gate terminals of the first and second pull-up transistors and the first and second pull-down transistors depending on whether the input signal makes a rising or a falling transition.

18. The output driver of claim 17 wherein the delay generator comprises a plurality of serially-coupled inverters coupled to receive the input signal, each inverter introducing a predetermined delay, the plurality of inverters generating the delayed versions of the input signal.

19. The output driver of claim 17 wherein the plurality of switches comprises:
- a first pair of switches coupled to a gate terminal of the first pull-up transistor;
- a second pair of switches coupled to a gate terminal of the first pull-down transistor;
- a third pair of switches coupled to a gate terminal of the second pull-up transistor; and
- a fourth pair of switches coupled to a gate terminal of the second pull-down transistor,
  wherein, each switch in each pair is controlled by the input signal or a complement of the input signal.

20. The output driver of claim 19 wherein each switch comprises a CMOS transmission gate.

* * * * *